United States Patent [19]

Raschke

[11] Patent Number: 4,745,321
[45] Date of Patent: May 17, 1988

[54] REFLECTIVE ARRAY SURFACE ACOUSTIC WAVE DEVICE

[75] Inventor: Curt R. Raschke, Dallas, Tex.

[73] Assignee: Texas Instruments Incorporated, Tex.

[21] Appl. No.: 16,526

[22] Filed: Feb. 18, 1987

Related U.S. Application Data

[63] Continuation of Ser. No. 790,771, Oct. 24, 1985, abandoned, which is a continuation-in-part of Ser. No. 633,771, Jul. 23, 1984, abandoned.

[51] Int. Cl.$^4$ .............................................. H01L 41/08
[52] U.S. Cl. ................................. 310/313 D; 333/153; 333/195
[58] Field of Search ........... 310/313 R, 313 B, 313 C, 310/313 D; 333/150–155, 193–195

[56] References Cited

U.S. PATENT DOCUMENTS

| | | | |
|---|---|---|---|
| 3,833,831 | 5/1975 | Williamson et al. | 310/313 D X |
| 4,155,057 | 5/1979 | Sandy et al. | 333/195 |
| 4,166,228 | 8/1979 | Solie | 310/313 D |
| 4,309,679 | 1/1982 | Furuya et al. | 333/195 |
| 4,319,154 | 3/1982 | Solie | 310/313 D |
| 4,349,794 | 9/1982 | Kagiwada et al. | 333/195 X |
| 4,353,046 | 10/1982 | Hartman | 310/313 D |
| 4,426,595 | 1/1984 | Kawaura et al. | 310/313 D |
| 4,484,160 | 11/1984 | Riha | 310/313 D |

*Primary Examiner*—Mark O. Budd
*Attorney, Agent, or Firm*—Richard K. Robinson; James T. Comfort; Melvin Sharp

[57] ABSTRACT

A reflective array surface acoustic wave signal compressor or expander (RAC) has a piezoelectric substrate (LiNbO$_3$) upon which is deposited an input transducer and an output transducer and etched therein a reflective grating. The RAC grating comprises reflective elements which includes a plurality of grooves having either uniform depths and lengths and preselected widths or uniform depths, lengths and widths for producing a flat pass band or a desired frequency characteristic. Yields are increased owing to the simplified fabrication process and costs decreased owing to batch fabrication made possible by the resulting simplified fabrication-process.

4 Claims, 2 Drawing Sheets

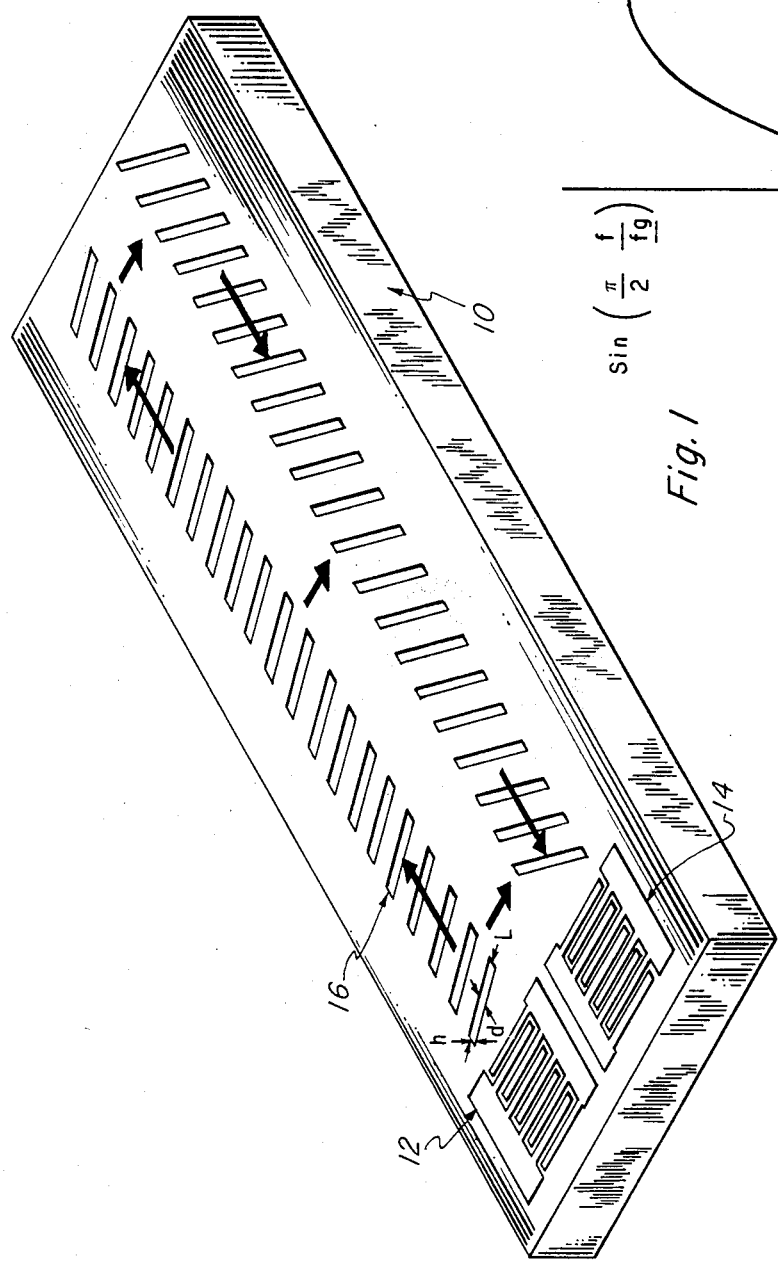
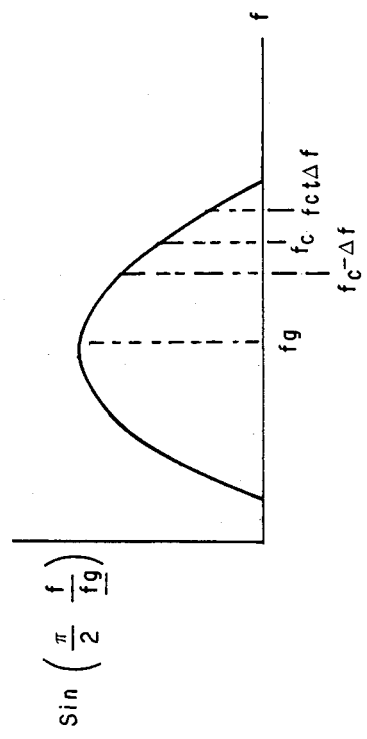

REFLECTIVE ARRAY SURFACE ACOUSTIC WAVE DEVICE

This application is a continuation of application Ser. No. 790,771, filed Oct. 24, 1985, now abandoned, which is a continuation-in-part of application Ser. No. 633,771, filed July 23, 1984, now abandoned.

This invention relates to surface accoustic wave (SAW) devices and more particularly to a reflective array SAW device.

In the past reflective array SAW devices such as those shown in FIG. 1 have an acoustic signal launched by the input transducer. The acoustic signal is selectively reflected by the etched grating back to the output transducer when the local grating period is equal to one wavelength of the surface acoustic wave. The reflectivity depends on the SAW wavelength, the grating period, the groove width, the groove length and the groove depth. Two ways have existed for "weighting" the impulse response of a grating—varying the groove depth or groove length. If "length weighting" is employed, an objectionable distortion of the wavefront of the incident wave may occur if the grooves significantly slow the wave. On the other hand, length weighting is often desirable because the weights of successive grooves can be significantly different, the grating can be etched to uniform depth, and the response of the grating can be reliably reproduced because the weighting is specified by the photomask.

However, with depth weighting it is difficult to etch gratings whose groove's depths, vary rapidly with position. Etching grooves with varying depths is more complicated and requires more time than etching grooves of uniform depth. For a more comprehensive report on the design, construction and use of reflection grating filters see Richard C. Williamson's article "Nine Reflection Grating Filters" in a book "SURFACE WAVE FILTERS", edited by Herbert Matthews and published by John Wiley & Sons.

In substrates used for large bandwidth devices, for example, LiNbo3 or LiTaO3 substrates, the grating grooves were etched using an ion milling process; a process which is extremely difficult to control. Thus, complicated depth weightings were seldom used and in lieu thereof the practice was to make a transducer which was matched to have a flat response over the pass band and then to decrease the depth linearly with frequency for decreasing the wavelength and to keep the ratio of the depth to wavelength approximately constant.

While this approach decreased the control needed on the milling process, the process retains a very high degree of difficulty. To change the depth with position, even for the simple linear chirp slope case, an aperture has to be moved over the substrate to limit the etch area and the motion of the aperture varied to vary the depth by changing the actual etch time of the various points on the substrate. The smaller the aperture, the finer the control. However, the smaller the aperture the longer the milling time and with longer milling time, system stability problems develop. In addition, this approach precludes batch processing, because each device has to be made sequentially.

Accordingly it is an object of this invention to provide a reflective array surface acoustic wave transducer having inherently flat response over a selected pass band.

Another object of the invention is to provide a grooved reflective grating whose grooves have uniform depths and lengths and either uniform widths or preselected widths for providing a uniform flat response.

Another object of the invention is to provide a reflective array compressor which can be batch produced.

Still another object of the invention is to provide a reflective compressor which is economical to fabricate.

Briefly stated the reflective array surface acoustic wave transducer of the invention has an input and output transducer formed on a suitable substrate, and a grooved reflective grating. In a first embodiment, the grating comprises etched grooves having uniform depths and lengths and preselected widths for producing a reflective array signal compressor or expander having a flat pass band response for radar applications. In a second embodiment the etched grooves have uniform depths, lengths, and widths for obtaining a desired frequency response. Stated broadly the invention provides third and fourth means for weighting the impulse response of a grooved reflection grating.

Other objects and features of the invention will become more readily apparent from the following detailed description when read in conjunction with the accompanying drawings, in which:

FIG. 1 is an isometric view of a prior art reflective array surface acoustic wave transducer;

FIG. 3 is a chart of the sinusoidal relationship between the center frequency ($f_c$) the frequency whose groove width is one half the wavelength ($f_g$) and the groove width dependent term in the groove reflectivity equation.

Figure 2A:
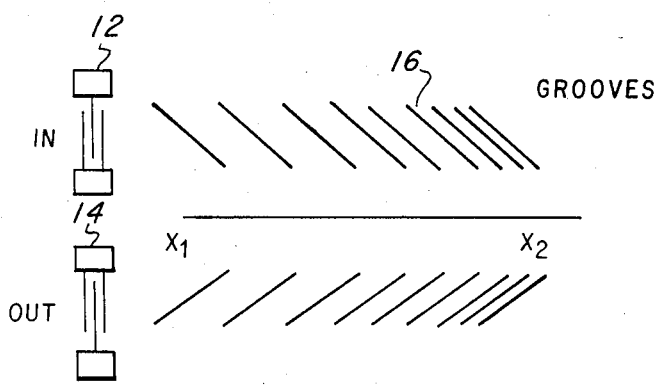
FIGS. 2a-2e depict reflective array SAW transducer principles.
Figure 2B:
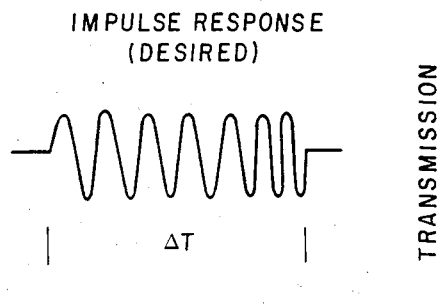
Figure 2C:
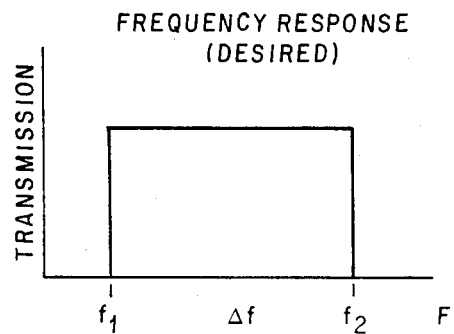
Figure 2D:
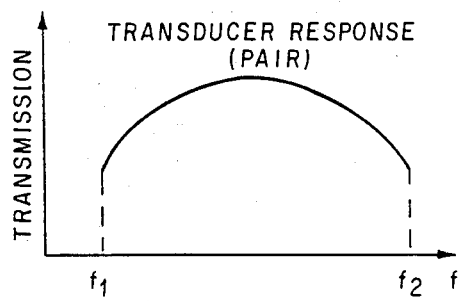
Figure 2E:
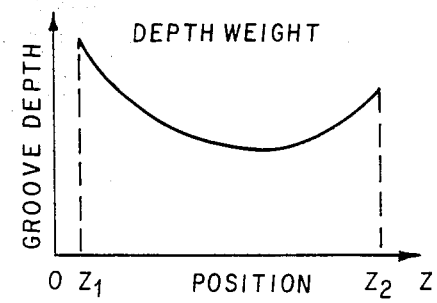

Referring now to FIG. 1 for a brief description of a prior art reflective array SAW transducer, a substrate 10 of, for example, lithium niobate (LiNbO$_3$), has an input transducer 12 and an output transducer 14 formed thereon adjacent to one end of the substrate and a grooved grating 16, having either lengths or depths varied in a predetermined manner from groove to groove, etched in the surface of the substrate 10 adjacent to the transducers 12 and 14. When electrically excited, the input transducer 12 launches an acoustic signal into the etched grating 16. When the local grating spacing equals the wavelength of the frequency component, the frequency components of the acoustic signal are selectively reflected to the output transducer. Those persons skilled in the art desiring additional information concerning the prior art devices are referred to U.S. Pat. No. 3,883,831, issued May 13, 1975 to Williamson et al.

Applicant discovered while trying to manufacture larger quantities of the prior art type grooved RAC devices having predetermined depths from groove to groove that unwanted changes in the supposed to be uniform groove width (d) caused changes in the frequency response. To quantify the change the actual formula for the reflectivity ($\rho$) of a single groove was used as follows:

$$\rho = 2k(h/\lambda) \sin (\pi d/\lambda) \tag{1}$$

where $\rho$=reflectivity, k is a material constant, h=groove depth, $\lambda$=wavelength and d=groove width.

The frequency is:

$$f = (g)/\lambda \quad (2)$$

where g is the local wave phase velocity.

The frequency where the groove width (d) equals $\frac{1}{2}$ the wavelength ($\lambda$) is:

$$f_g = (g)/2d \quad (3)$$

By substitution the reflectivity equation becomes:

$$\rho = 2k/(g)(hf) \sin(\pi f/2f_g) \quad (4)$$

Referring now to FIG. 3, from which it can be seen that if fg is chosen to be less than the center frequency (fc), the sin term decreases with frequency over the bandwidth of interest (fc±Δf), and in fact there is an fg that keeps the f sin ($\pi$f/2fg) substantially constant over the frequency bandwidth 2Δf.

For example, assuming fc=850 megahertz, and delta f=80 megahertz a reasonably flat response over a 160 megahertz (2f) bandwidth is achievable. The groove width d corresponding to fg is less than the SAW wavelength at the upper band edge, showing that the grating pattern exists throughout the frequency range. The fg for this example, determined from the formula by trial and error, is 570 megahertz. As this frequency and its harmonics are outside the grating pass band, any perturbations generated by the finite groove widths will be rejected. It has been determined also that by knowing the desired frequency response characteristics of the device, uniform length, depth and width dimensions for the grooved reflective grating can be obtained.

In operation, a reflective array SAW device is designed in accordance with the formulas (3) and (4) and a photo-mask made having the desired uniform groove lengths and either preselected widths or uniform widths. The mask is then used to pattern an etch mask for the, grooves having either the preselected widths or uniform widths on the substrate. Then the grooves are etched to uniform depths on the substrate. For large bandwidth devices a suitable material for the substrate is, for example, LiNbO$_3$ or LiTaO$_3$. As the fabrication processes are well known processes within the knowledge of those skilled in the art the processes are not described.

Although only a single embodiment of the invention has been described, it will be apparent to a person skilled in the art that various modifications to details of construction shown and described may be made without departing from the scope of this invention.

What is claimed is:

1. A reflective array surface acoustic wave device comprising:
   (a) a substrate of material having preselected surface wave propagation characteristics;
   (b) transducer means operatively combined with said substrate for converting electrical impulses into acoustic waves in the surface of the substrate and for converting reflected acoustic waves received from the surface of the substrate into electrical impulses; and
   (c) the substrate having a plurality of space grooves utilized as a reflection grating means for responding to surface acoustic waves having a preselected band of frequencies with a center frequency, the plurality of grooves having predefined lengths, widths and depths, with single grooves being responsive to preselected frequencies of surface acoustic waves based upon the widths of each single groove being selected such that the sin of $\pi$ times the ratio of the groove width divided by the wavelength of the center frequency is less than 1, the substrate being in operative association with the transducer means for receiving and reflecting impinging acoustic surface waves to the transducer means.

2. The reflective array surface acoustic wave device according to claim 1 wherein the substrate is LiTaO$_3$.

3. The reflective array surface acoustic wave device according to claim 1 wherein the transducer means includes first and second interdigital transducers for converting the electrical signals into acoustic waves and the reflected waves back into processed electrical signals.

4. The reflected array surface acoustic wave device according to claim 1 wherein the preselected width of the plurality of grooves is determined to be equal to one half the wavelength of the center frequency.

* * * * *